United States Patent [19]

Saccocio et al.

[11] Patent Number: 4,474,621
[45] Date of Patent: Oct. 2, 1984

[54] METHOD FOR LOW TEMPERATURE ASHING IN A PLASMA

[75] Inventors: Edward J. Saccocio; Mark E. Holycross, both of Columbus, Ohio

[73] Assignee: International Telephone and Telegraph Corporation, New York, N.Y.

[21] Appl. No.: 388,969

[22] Filed: Jun. 16, 1982

[51] Int. Cl.³ .............................................. B08B 7/00
[52] U.S. Cl. ........................................ 134/1; 134/38; 156/643
[58] Field of Search ...................... 134/1, 38; 156/643, 156/646, 668; 204/192 E

[56] References Cited

U.S. PATENT DOCUMENTS

| | | | |
|---|---|---|---|
| 3,615,956 | 10/1971 | Irving et al. | 156/646 X |
| 4,028,155 | 6/1977 | Jacob | 204/192 E X |
| 4,138,306 | 2/1979 | Niwa | 156/646 X |
| 4,243,476 | 1/1981 | Ahn et al. | 156/643 |
| 4,307,178 | 12/1981 | Kaplan et al. | 156/643 X |

OTHER PUBLICATIONS

Desilets et al., "Reactive Species Generation for Plasma Etching by Ion Bombardment of a Suitable Compound", IBM TDB, vol. 22, No. 1, Jun. 1979, pp. 112–113.
Anderson et al., "Resist Residue and Oxide Removal Prior to Plating, Lift-Off and Etching", IBM TDB, vol. 21, No. 5, Oct. 1978, p. 2108.

Primary Examiner—Marc L. Caroff
Attorney, Agent, or Firm—John T. O'Halloran; Alfred C. Hill

[57] ABSTRACT

Ashing rates of encapsulants exposed to an oxygen plasma in a reactor are increased by simultaneously exposing a solid halogen-substituted hydrocarbon polymer to a plasma jet formed within a cavity in a grounded conductive surface of the reactor. Advantageously the solid reactant may be polyvinyl chloride or polytetrafluoroethylene in solid form.

17 Claims, 19 Drawing Figures

METHOD FOR LOW TEMPERATURE ASHING IN A PLASMA

BACKGROUND OF THE INVENTION

This invention relates generally to radio frequency (RF) excited gas plasma reaction devices.

Low temperature ionized gas, or cold plasma, has become widely employed for reaction with non-gaseous substances for processing as well as analytic purposes. In a low-pressure oxygen plasma, for example, substances can burn or oxidize at near room temperatures that otherwise would require 10 times the temperature for the same reaction. Apparatus called reactors are generally used for plasma generation. In a continuously pumped chamber or reacter, oxygen at low pressures, e.g. 1 mmHg, is energized by RF power.

Since about 1976, interest in plasma reactors has been stimulated by Integrated Circuit (IC) fabrication technology. It became apparent that manufacturing steps such as photo-resist stripping and wafer material removal, or etching, could be accomplished in a plasma discharge with significant advantages. As commercial plasma machines became available to IC manufacturers, work began to appear on the use of plasma in failure analysis such as in ICP Operating Bulletin #73, Stripping Wafers with Plasma (1978), International Plasma Corporation, Hayward Calif.; Plasma Etching, *Circuits Manufacturing* April 1978, p. 39, Thickness Variance of Spun on Photo Resist, *Circuits Manufacturing*, April 1978, p. 71; and Decapsulation of Epoxy Devices Using Oxygen Plasma, D. D. Wilson et al, Annual Reliability Physics Syniposium Proceedings, 1977, p. 82. While plasma is quite competitive in removing certain organics such as photo resists, it is less so with respect to stripping plastic encapsulants. This is partly, but not entirely, due to the material thickness involved.

At a particular point in the failure analysis of an encapsulated IC, the IC must be opened for the analysis to continue. This presents the problem of removing the encapsulant as completely as possible with a minimum or no alteration to the underlying circuit. For hybrid IC's the removal problem is aggravated by the nature and makeup of a hybrid which is a complex, multicomponent microcircuit comprised of many materials. Chemical strippants have been successful with some plastic devices but are not usable on hybrid IC encapsulants because of the circuit materials and resultant component damage.

Low temperature plasma stripping can be used to strip or ash encapsulants utilized in hybrid IC's. Reaction temperatures appear to be compatible with hybrid components and no serious material problems are apparent. However, the process is extremely slow, taking as long as three or more work days to ash the encapsulants.

The usual accelerating agent $CF_4$ cannot be used since it has been found to damage the IC. Additionally, the relatively thick encapsulants cannot easily be mechanically or otherwise thinned prior to plasma exposure.

Commercial plasma reactors are generally available in two basic configurations: one having a planar geometry with parallel internal electrodes and the other being a barrel reactor having cylindrical and external electrodes. The behaviour and performance of each type is very different.

The equipment to produce and contain a plasma involves three fundamental functions: a reaction chamber exhausted via a vacuum system, provision for a regulated gas flow, and excitation. The reaction chamber is electrically discharged by means of Radio Frequency (RF) energy. The gas is maintained at low pressure by continuous pumping and is excited through electron-molecular collisions driven by the RF energy; that is, electrons and ions respond to the RF electronic field, and their collisions bring about various excited molecular and atomic species. It is through these dissociated and excited species that highly activated chemistry may take place.

Gas discharges, often called glow discharges, have been studied for more than 100 years. Early work used DC discharges; RF and microwave discharges are more common today. Plasma discharges, either DC or RF, involve highly complex phenomena; these phenomena are generally understood now. Of major complexity and importance are the electron, ion, and atomic distributions in a discharge. These are a function of electronic field distribution, gas flow, pressure, materials in contact with the plasma (including specimens), geometrics of the apparatus, applied power, and others.

J. L. Vossen in Fourth International Plasma Chemistry Conference Proceedings, pp. 344, 1979, International Union of Pure and Applied Chemistry ISPC-IV; and Jour. Elec. Chem. Sol., 126 No. 2, February 1979, p. 319, discussed glow discharge phenomena relative to plasma conditions, emphasizing that a glow discharge is not simply a source of electrons that dissociates molecules. In a review publication, Vossen describes the merits of the Reinberg radial gas flow system described in U.S. Pat. No. 3,757,733, which accommodates the co-creation and consumption of reactive species. Flow and flow rate considerations are most important for reaction uniformity. Vossen points out that gas flow is not a simple, independent parameter; other parameters are equally complex. Vossen discusses at some length an important phenomenon found in RF discharges. A direct current bias potential is produced at internal electrodes as a result of the inability of the massive ions to follow the RF field with the same mobility as the electrons. In a barrel reactor, bias potentials do not form since electrodes are not in direct contact with the plasma. Common to both reactor types, however, are ion or dark space sheaths that result at walls and at internal electrodes. These sheaths are important and play a large role in active species generation and recombination. The sheaths are pressure dependent, and changes in pressure will thereby strongly affect active species. Specimen surfaces also interact with the plasma, adding to the difficulty of anticipating reactions and rates. Sheaths can also form on specimens.

Examples of various prior art reactors and methods of ashing various substances are taught in U.S. Pat. Nos. 3,795,557; 4,017,404; 4,134,817; 4,073,669; 3,875,068; 3,705,091; 4,066,037; 3,647,676; 3,879,597; 3,616,461; 3,619,403; 3,806,365; 4,028,155; and 3,671,195.

SUMMARY OF THE INVENTION

In accordance with the principles of the invention, improved reactors are provided wherein ashing rates of phenolformaldehyde encapsulants are significantly increased over prior art reactors. In accordance with the principles of the invention, one end wall of the reactor is formed of conductive material which is in contact with the plasma and which is connected to RF ground.

Further, in accordance with the principles of the invention, the conductive wall includes one or more apertures wherein plasma jets form.

In one embodiment of the invention, a barrel reactor has one end formed by a metallic plate which is connected to ground. An aperture in the plate is in communication with an elongated closed end tube.

In another embodiment of the invention a reactor comprises a glass cylinder closed at each end by conductive metallic plates. A pair of spaced apart conductive electrodes are supported within the cylinder. The electrodes are connected to an RF source and the end walls are connected to RF ground in common with one of the electrodes. At least one of the electrodes has a plurality of bores in its surface which is adjacent the other electrode.

Further in accordance with the invention, one of the electrodes is supported on one of the conductive plates by a conductive tube through which gas is exhausted.

Further in accordance with the principles of the invention, reaction rates are dramatically improved by the addition of a halogen substituted hydrocarbon polymer in solid form such as polyvinyl chloride (PVC) or polytetrafluoroethylene (PTFE).

BRIEF DESCRIPTION OF THE DRAWINGS

The invention will be better understood from a reading of the following detailed description in conjunction with the drawings in which.

DETAILED DESCRIPTION

Figure 1:
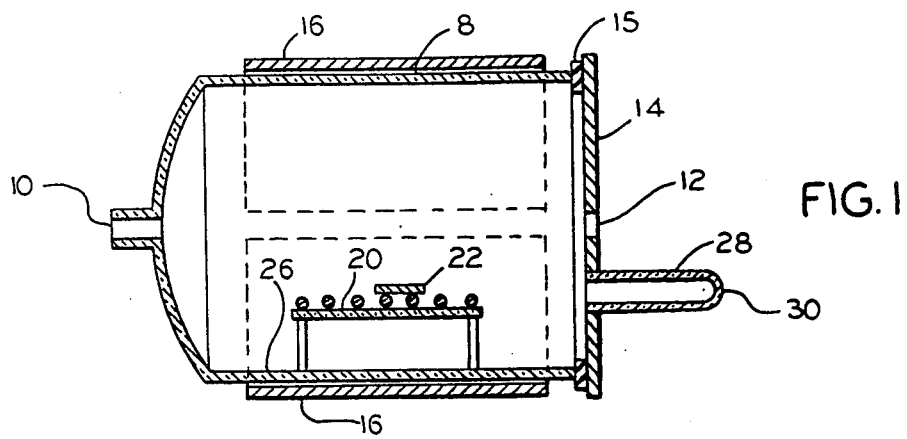
FIG. 1 illustrates a first reactor in accordance with the principles of the invention.

FIG. 1 illustrates a plasma machine having a barrel type reactor such as that taught in U.S. Pat. No. 3,671,195 to R. L. Bersin modified in accordance with the invention. The reactor chamber 8 includes an inlet 10 to which suitable conduits (not shown) are connected to transport gas such as oxygen gas ($O_2$) at pressures of a few mm. of mercury from a source (not shown) of gas into the chamber at a closely controlled rate. An outlet 12 is connected to a suction pump (not shown) for exhausting or withdrawing gas from the interior of the chamber. The chamber is closed with a cover 14 and includes means such as opposing plate electrodes 16, or an inductor coil (not shown), for ionizing the gas inside the chamber. The cover 14 is formed of a metallic conductor (aluminum) and a seal between the cover 14 and the chamber 8 is provided by gasket 15. The cover 14 includes one or more apertures. Only one such aperture is shown in FIG. 1. The aperture is in communication with a tube 28 having its one end 30 closed. A support rack 20 is provided within the chamber for supporting specimens of interest.

The electrodes 16 are connected with a radio frequency (RF) generator (not shown) which energizes the electrodes to generate an RF field between them. One of the electrodes as well as the cover 14 is connected to a common RF ground.

The gas is excited and ionized by the RF field to form a plasma at a relatively low temperature, for example between about 100° C. and 150° C., where such plasma generally exhibits a visible glow. When the plasma is transported over and into contact with an organic substance placed on support rack 20, the plasma oxidizes the substances generally with little if any loss of the organic residue, as would be the case with high temperature ashing techniques.

A sample or specimen 22 is disposed in the chamber resting on rack 20 which in this embodiment comprises a plurality of spaced apart glass rods. The sample is thereby spaced from the chamber walls 26. The open spaces of the rack 20 permit passage of the plasma as it travels from inlet 10 to outlet 12 and facilitate the gas exchange in the space beneath the underside of sample 22. This enhances the obtainable rate of oxidation of the sample.

Figure 2:
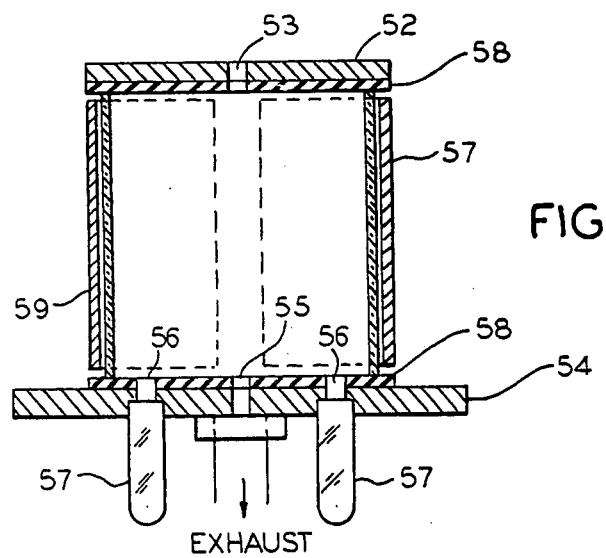
FIG. 2 illustrates a second reactor in accordance with the principles of the invention.

FIG. 2 illustrates a second embodiment of the invention wherein metallic end plates are used on both ends of a glass cylinder. In FIG. 2, a glass cylinder 51 (5" long and 7" in diameter) has an upper plate 52 formed of ½" aluminum having an aperture 53 which serves as an inlet and a lower plate 54 formed of 1" alumimum having a central aperture 55 for an exhaust outlet and a plurality of other apertures 56 each of which is in communication with a closed end glass tube 57. Vacuum seals 58 between the aluminum plates and the glass cylinder 51 are of silicon rubber. Electrodes 59 fabricated from perforated aluminum sheet are shaped to fit the outside contour.

Figure 3:
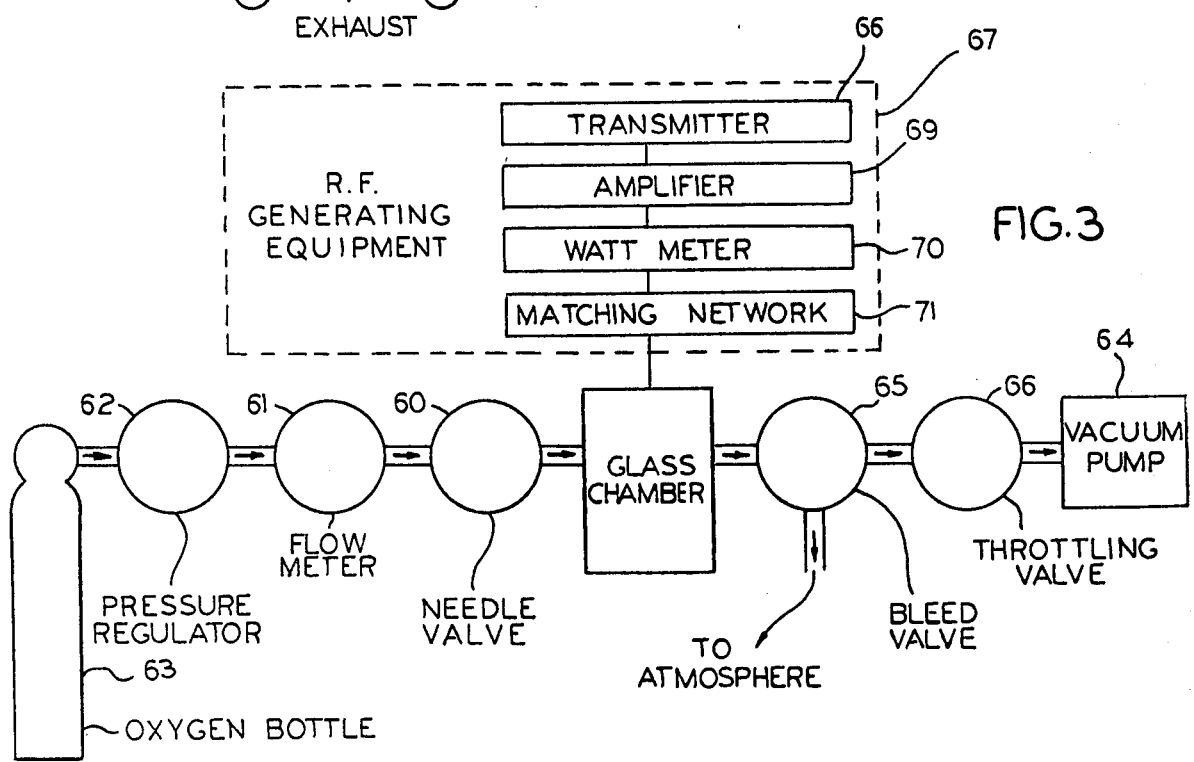
FIG. 3 illustrates in block diagram form the equipments utilized in conjunction with a reactor in accordance with the invention.

FIG. 3 illustrates schematically the assembly of equipments including the reactor of FIG. 2. The inlet of the reactor is coupled via a needle valve 60, flow meter 61 and pressure regulater 62 to a source of oxygen 63. The outlet or exhaust of the reactor is coupled to a vacuum pump 64 via a bleed valve 65 and a throttling valve 66. RF generating equipment 67 is coupled to the reactor electrodes. The equipment 67 comprises a transmitter 68, amplifier 69, watt meter 70 and a matching network 71. The equipment 67 is capable of delivering 0–1000 watts R.M.S. at 13.56 mHz. The equipment set up, shown in FIG. 3, may be used with any of the various reactor embodiments described herein.

Figure 4:
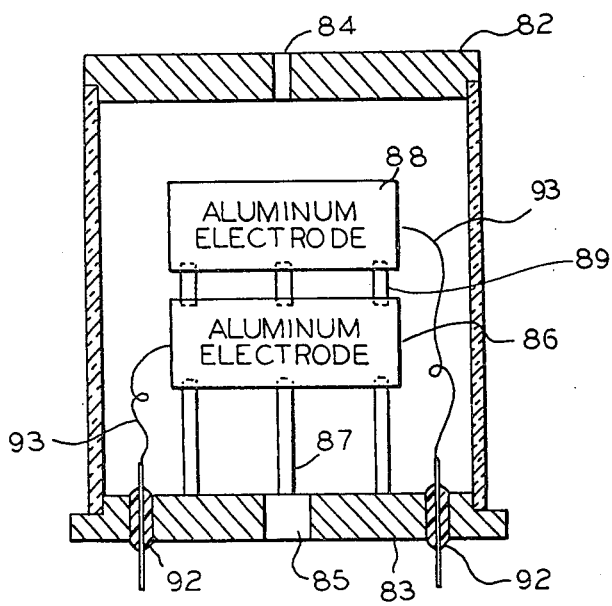
FIG. 4 illustrates a third reactor in accordance with the principles of the invention.

FIG. 4 illustrates a third embodiment of the invention which is arranged so that the vacuum exhaust produces a radial flow of gases over internal planar electrodes.

Figure 5:
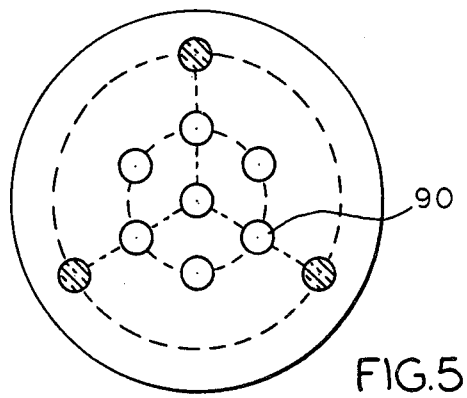
FIGS. 5 and 6 illustrate a plasma electrode in bottom and end views, respectively, of the reactor of FIG. 4.
Figure 6:
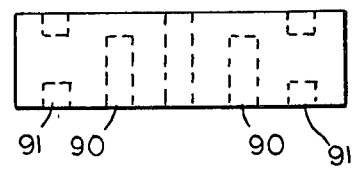

The reactor comprises a glass cylinder 81 having an aluminum top plate 82 and an aluminum bottom plate 83. Plate 82 includes an aperture 84 which serves as an inlet and plate 83 includes aperture 85 which serves as an outlet or exhaust. Two electrodes formed of 1 inch thick, 4 inch diameter aluminum disks are supported in the reactor. The bottom electrode 86 is supported and insulated from the bottom plate 83 by three glass rods 87. The top electrode 86 is supported above the bottom electrode 86 by three glass rods 89 such that the separation between the electrodes is 1 cm. The top electrode as seen in FIGS. 5 and 6 includes seven cavities 90 each 5/16" in diameter. The bases 91 shown in FIGS. 5 and 6 receive the ends of glass rods 89. Electrical feedthrough 92 are provided so that the RF may be coupled to electrodes 86, 88 via wires 93. Specimens to be acted upon are placed between the electrodes 86, 87.

Figure 7:
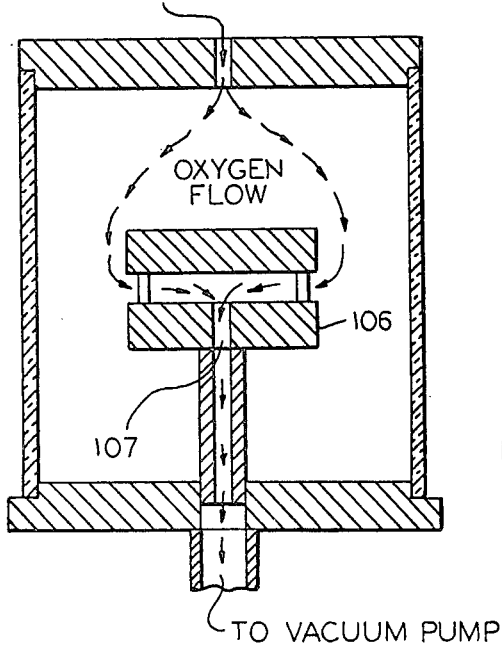
FIG. 7 illustrates a fourth reactor in accordance with the principles of the invention.

FIG. 7 illustrates a fourth embodiment of the invention which is similar to that of FIG. 4 and identical parts are numbered the same. The difference between the embodiments of FIGS. 7 and 4 is that in FIG. 7 the lower electrode is supported by an aluminum tube. More specifically, the lower electrode 106 includes a central aperture 107. Electrode 106 is supported on the tube 108. Tube 108 includes a passageway which is in communication with aperture 107 and exhaust or outlet 85. As will be explained below, this structure provides a heat sink to the bottom plate 83 and the flow of gases is improved.

The reactors described above were utilized to ash a phenolformaldehyde encapsulant used to encapsulate hybrid IC's. The encapsulant is Durez available from Hooker Chemical Co., Buffalo, N.Y. Durez is a 50% filled material which has been analyzed as being calcium carbonate, which is unusual to encapsulants. More often, in electronic applications, the filler is glass. Ashing of Durez in an oxygen plasma volatilizes the organic compounds, leaving behind noncombustibles, in this case pure calcium carbonate. In order to permit the plasma-associated reactions with the remaining organics to continue, the ash was removed periodically by air dusting.

In testing the various reactors, specimens of Durez were prepared on standard glass slides. The specimens were placed into the reactors and at periodic intervals the total loss of material, including that dusted, was measured on an electronic balance.

The ash rates obtained with the reactor of FIG. 1 when the aluminum plate was replaced with a glass plate so as to approximate a prior art barrel reactor was 30 mg. per hour. With the aluminum plate in place and connected to ground, and further with the aluminum plate having a glass extension tube forming a plasma jet, an ash rate of 45 mg. per hour was obtained. In both cases the pressure was 750 millitorr and the RF power was 100 watts.

It is noted that when the ground connection to the aluminum end plate was disconnected, a plasma jet would not form. Only with the aluminum end plate grounded, was a plasma jet formed in the glass tube. It was also observed that with an aluminum end plate at each end of the reactor and each connected to an identical point of RF ground, equal and opposite d.c. currents flowed to ground from each end plate. Thus, plasma jets could be formed in both end plates with appropriate apertures.

An increase in the number of plasma jets produced an even higher ash rate.

The apparatus of FIG. 2 having grounded aluminum end plates at either end was also tested in the assembly of FIG. 3.

The ash rate of a Durez coated glass slide (75×25 mm) was determined by measuring the weight change after hourly intervals in the plasma. The calcium carbonate residue was dusted off using compressed air before each weighing. For each experiment four coated glass slides were placed in the reactor on a small glass scaffold that enabled the coated glass slides to be uniformly distributed throughout the reactor.

Figure 8:
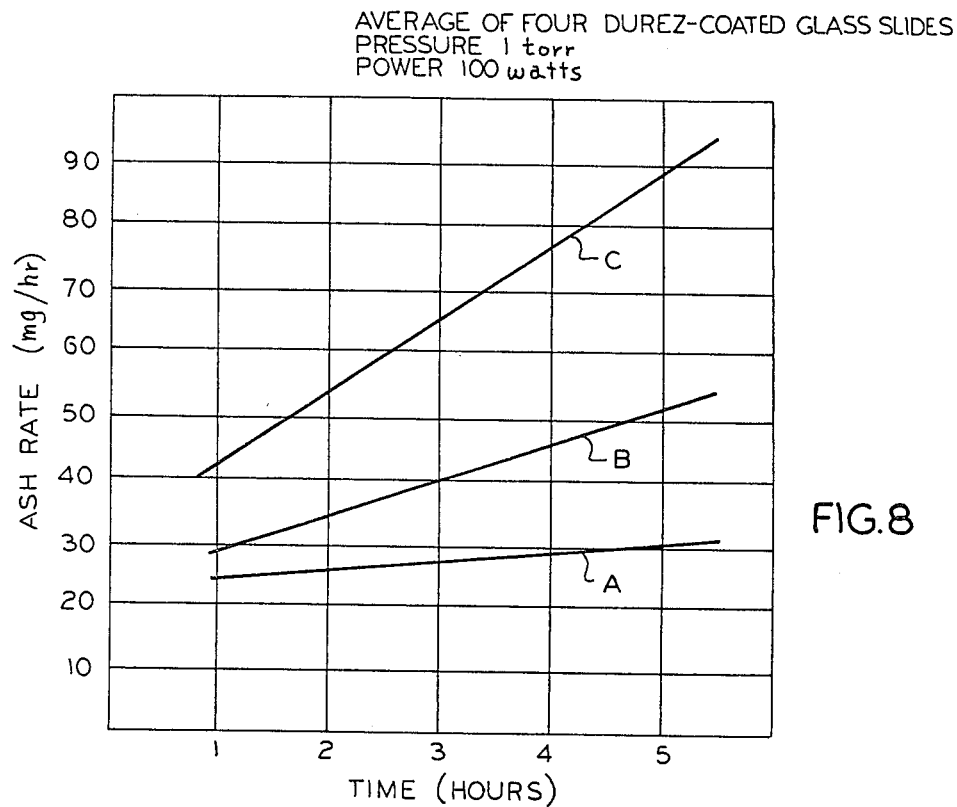
FIGS. 8–19 are graphs showing the ashing results obtained by the various reactors under various conditions.

Curves A, B and C of FIG. 8 illustrate the average ash rate of the four slides obtained as a function of time. The flow rates show in all curves are referenced to an at 760 mm Hg and 21° C. For curves A, B and C pressure of 1 torr was maintained and the RF power was 100 watts. The three curves A, B and C are at flow rates of 50 cm$^3$/min, 320 cm$^3$/min and 580 cm$^3$/min, respectively. It is noted that for a constant flow rate, an increase in pressure from 1 torr to 2 torr the ash rate increased by approximately 10 mg/hour.

Almost no work is reported in the literature relative to ashing or stripping with apparatus having internal plasma electrodes such as shown in the reactors of FIGS. 4 and 7.

The reactor of FIG. 4 was found to provide improved ashing rates. However, in some instances the temperature of the electrodes may become excessive. It was found that by modifying the structure of FIG. 4 to that shown in FIG. 7 heat is conducted from the bottom electrode to the aluminum base plate which in turn is cooled by ambient air.

It has been found that by introducing PVC or PTFE in solid form in the reactor, and in particular in the vicinity of the plasma jets, ashing rates are increased over prior art reactors by ten-fold.

Any surface exposed to a glow discharge will develop a small potential relative to the plasma. This potential will be negative because of the difference in mobility between electrons and ions. When a grounded or an electrically powered conductive surface is exposed to the plasma, a dark space or sheath is visible immediately in front of the surface. This sheath covers the entire surface and is believed to be a positive ion space charge, which is due to the negative surface charge produced by the high-velocity electrons. The thickness of the dark space is dependent upon chamber pressure. For a pressure of 1 torr, the dark space was observed to be approximately 2 mm. A very bright glow is observed next to the dark space. The extent of the glow region is also dependent upon pressure and is on the order of a few millimeters for pressures between 0.5 and 5.0 torr. The bright glow indicates a region where ionization and excitation processes are extremely active. This combination of glow and dark spaces appears to be similar to the series of dark spaces and glows observed in a DC, low-pressure glow discharge.

The dark space and glow regions appear to cling to the surface of the conductive material; when a cavity of sufficient size is made in the conductive surface, both regions enter this cavity and fill its entire volume. This volume of luminous and reactive gas is herein called a plasma jet. Materials such as PVC or PTFE, when placed within the jet, are reacted upon aggressively. In this work, the reaction products of the PVC or PTFE are shown to greatly enhance the desired stripping reaction of Durez with oxygen. This is evidently true in all the explained equipment where jets have been produced. However, when a reactive material such as PVC is placed within the plasma jet, as contrasted with arbitrary placements in the plasma chamber, a more controlled reaction ensues; that is, localization and an optimized reaction.

The plasma jets are similar in appearance to a phenomenon called the SESER (Source of electrons of selected energy range) effect, which involves the introduction of a constriction into a DC plasma. On the cathode side of the constriction, a high luminous, hemispherical glow called a plasma sac occurs. The average electron energy is considerably higher in the plasma sac than in the surrounding plasma regions. It is suggested that the SESER effect could be used in plasma chemistry to achieve very high reaction rates. We are not certain whether the plasma jets are manifestations of the SESER effect or a totally unrelated phenomenon.

One advantage of the plasma jets is that they produce small localized regions of very reactive gasses where the electronic temperatures (and molecular) are very high. When solid reactants are placed in the plasma jets, they are attacked vigorously. The products of these reactions are themselves active species for the oxidation of Durez, and diffuse into the relatively cooler plasma (electronically and molecularly) and volatilize the Durez. Thus, the Durez-coated specimens are not subjected to the high temperatures of the jets but receive the benefits of the high reaction rates in the plasma jets.

This process need not be limited to the oxidation of Durez assisted by PVC or PTFE. Other plasma processes could be conceived in which the plasma jets could be used to produce the active species for specific reactions. Also, it is conceivable that in certain situations an inert gas such as Argon could be used in the plasma, and the heat generated in the plasma jets could be used to produce the active species instead of a chemical reaction. It might be advantageous to introduce gaseous reactants into the chamber through the plasma jets. The plasma jets could then be used to activate the gas as it entered the chamber.

The plasma reaction products of oxygen with PVC or PTFE have not been identified.

It has been found that the improved reactions may be obtained by constructing the plasma jet tubes of FIGS. 1 and 2 from PTFE or PVC, or by placing PVC or PTFE in the plasma jet tubes of FIGS. 1 and 2, or by placing PVC or PTFE in the blind bores of the planar electrodes of FIGS. 4 or 7.

Figure 9:
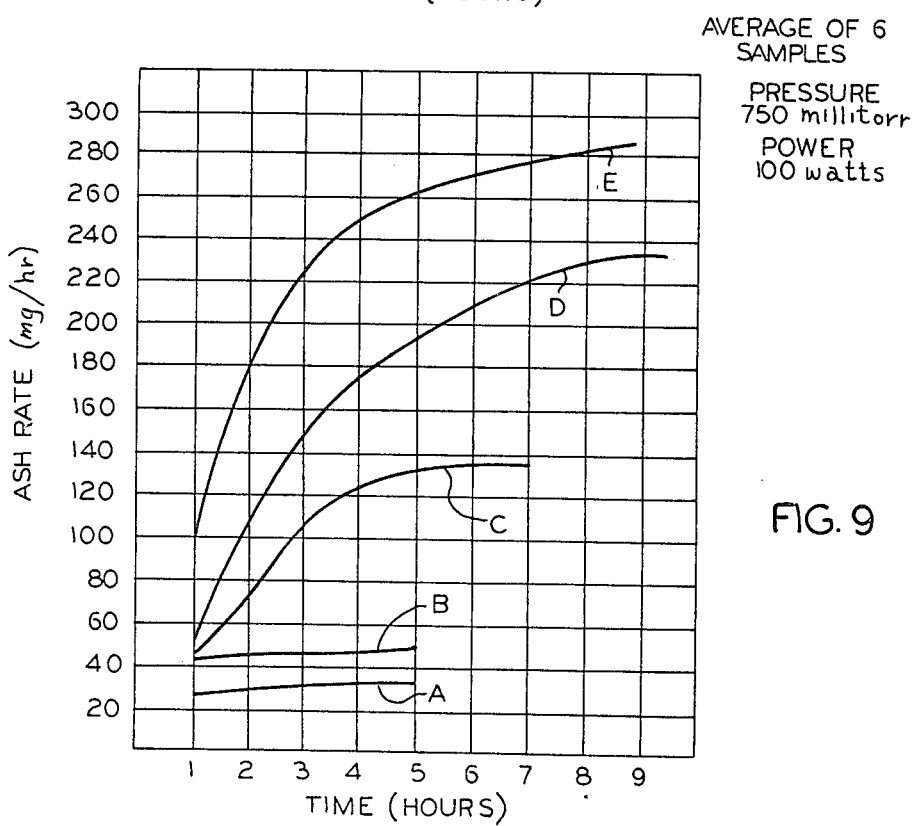

FIG. 9 is a graph illustrating the effects of PVC on the structure of FIG. 1.

The plasma jet tube of FIG. 1 when constructed from a piece of Tygon tubing produces ash rates which asymptotically approach 80 mg/hour. The surface texture of an ashed specimen becomes highly cavernous after a few hours in the enhanced plasma thereby providing an enormous increase in surface area. It was further observed that the introduction of PVC in solid form in a conventional barrel reactor dramatically increases the ash rate but by placing the PVC in a plasma jet produces even further dramatic increases in ash rates.

In FIG. 9, curve A represents the ashing rate of a conventional barrel reactor. Curve B illustrates the ashing rate for the reactor of FIG. 1. Curve C illustrates the rate for a conventional reactor with Tygon pieces placed in the reactor. Curve D shows the effect of using a single glass jet tube with Tygon pieces and curve E illustrates the effect of utilizing three plasma jet tubes with Tygon pieces.

An attempt to determine if volatiles from the PVC are responsible for the enhanced results was made by placing phthalic anhydride in vapor form and in solid form in the reactor. Negative results were obtained in both cases.

Three types of PVC produced the same effect, i.e., Tygon R-3603, Tygon S-50-HL and PVC insulated wire of unknown origin produced similar enhanced ashing.

Figure 10:
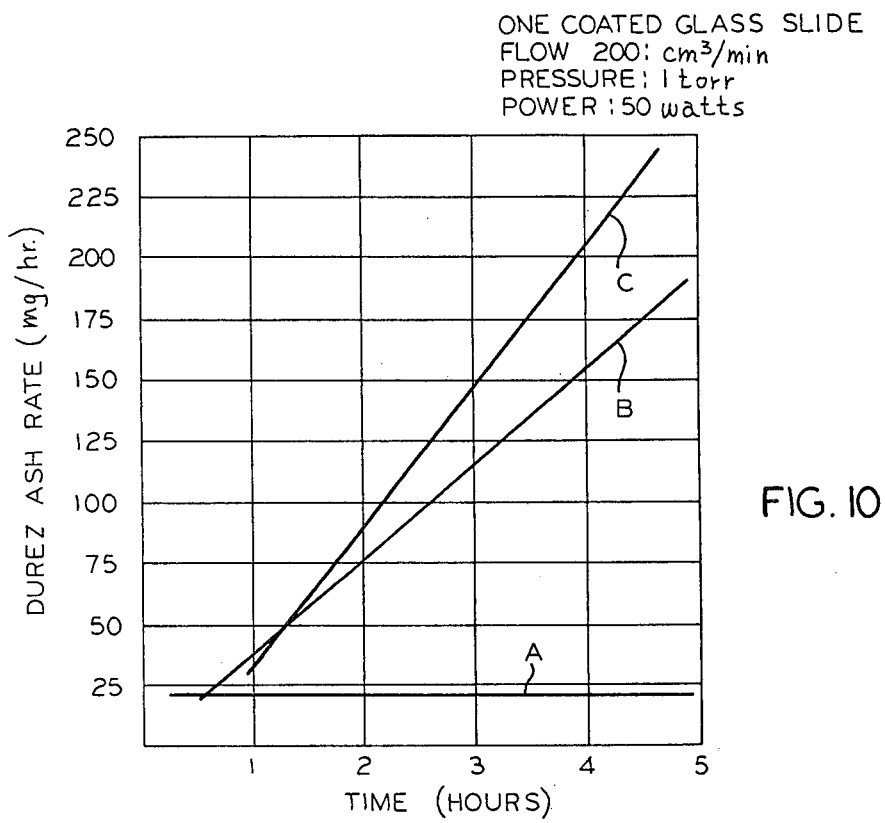

FIG. 10 illustrates the relative effects of Tygon and Teflon in the reactor of FIG. 3. Curve A illustrates the ashing rate with neither PVC nor PTFE in the reactor. Curve B illustrates the effect of inserting Tygon pieces in the plasma jets and curve C demonstrates the effect of placing Teflon Tape in the plasma jets.

Figure 11:
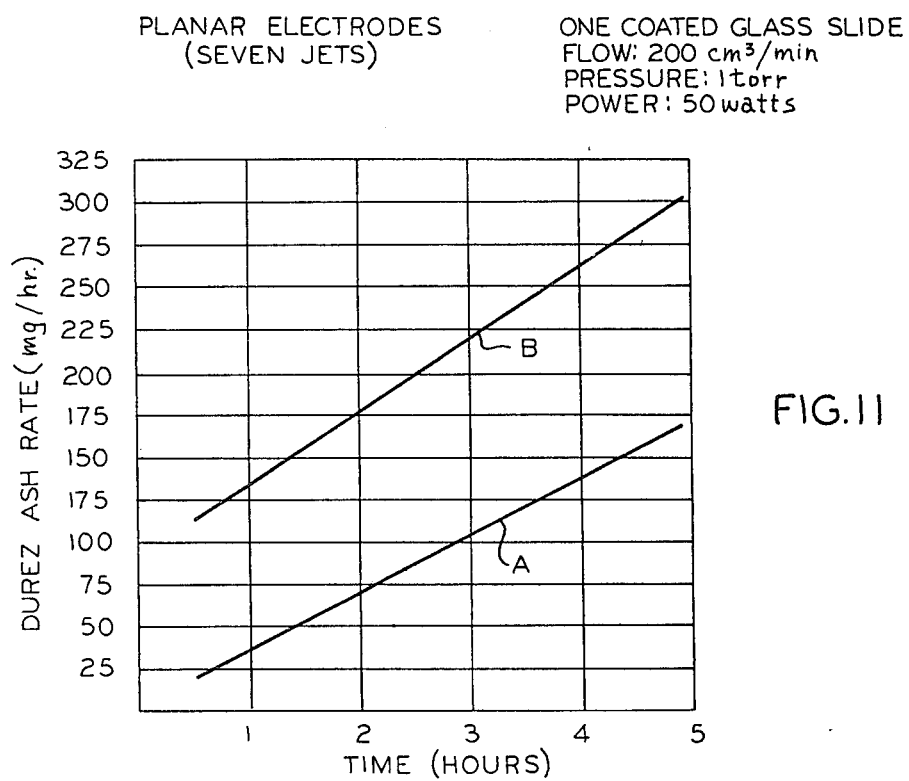
Figure 12:
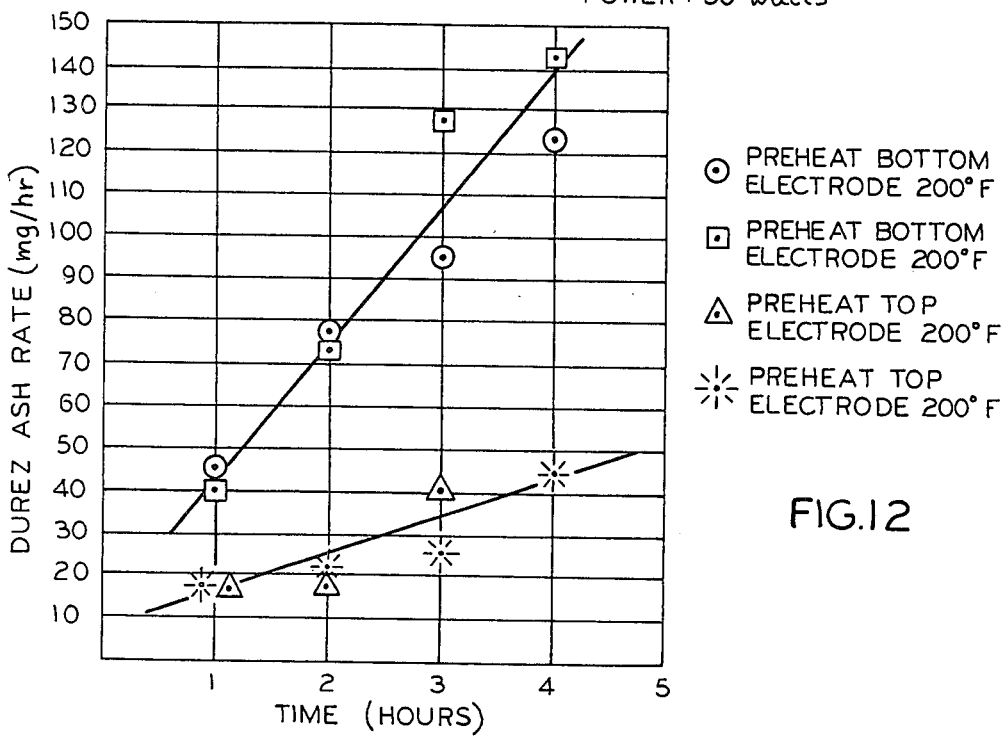

FIG. 11 shows the effect of electrode temperature on the ash rate when Teflon was used in an oxygen plasma (no Tygon). Again, when the electrodes were preheated to 200° F., the ash rate was greater than when the electrodes were cooled to room temperature between successive hour runs in the plasma. Both effects are additive. To better understand the role that electrode temperature plays, experiments were conducted in which the bottom electrode was first preheated to 200° F. while the top electrode was cooled to room temperature between successive hours in the plasma, and then conversely, the top electrode was preheated to 200° F. while the bottom electrode cooled. Results of these experiments are shown in FIG. 12. It is obvious that the bottom electrode temperature controls the ash rate. Since the Durez-coated substrate was in physical contact with the bottom electrode, and after a time came to thermal equilibrium with the electrode, it is apparent that the increase in ash rate with increasing temperature was due to nothing more than an increase in the reaction (oxidation) rate with temperature.

Figure 13:
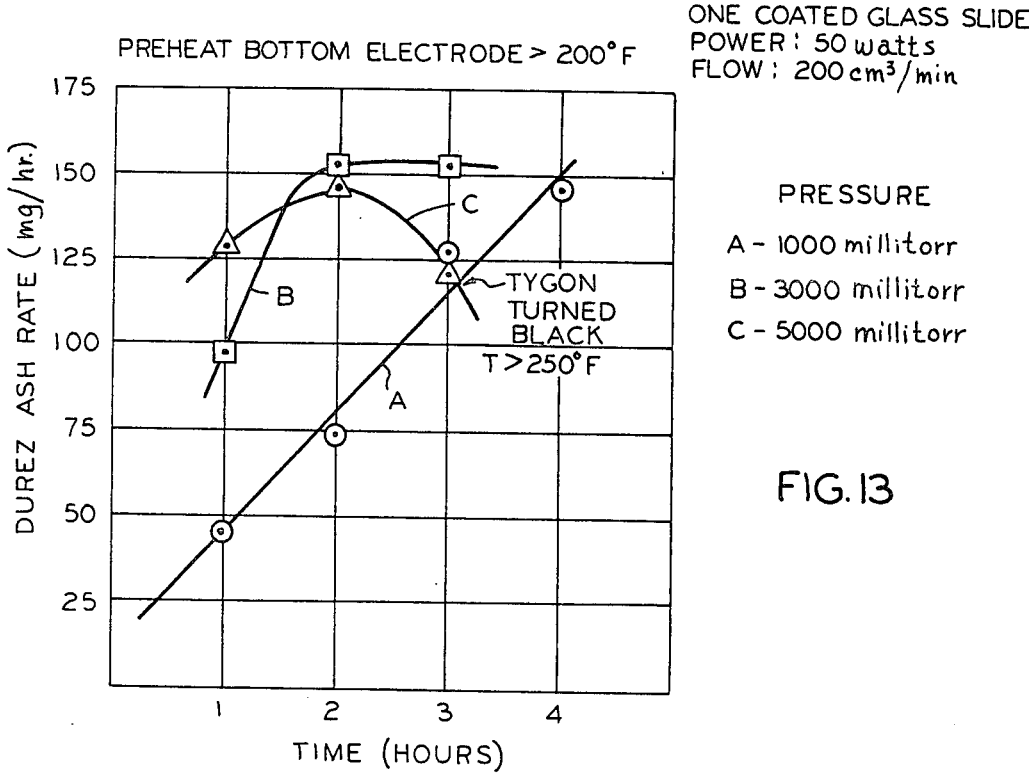

FIG. 13 shows the effect of pressure on the ash rate. There was a significant increase in ash rate when the pressure was increased from 1 to 3 torr. There was a smaller increase in ash rate when the pressure was increased from 3 to 5 torr.

Figure 14:
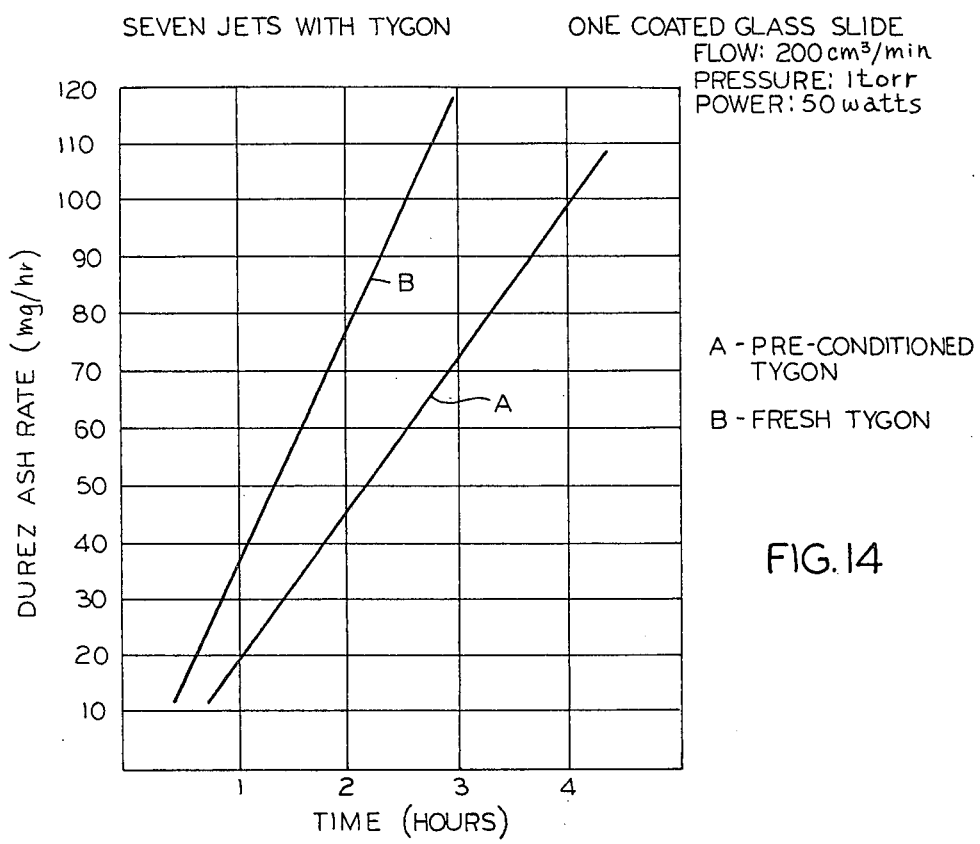

During the third hour (FIG. 13 curve C), there was a decrease in ash rate when the Tygon became so hot that it turned black. The condition of the Tygon can also affect the ash rate. FIG. 14 shows the differences in ash rates between fresh Tygon and Tygon that has been subjected to temperatures greater than 200° F. for 5 hours in the plasma. The used Tygon was already badly discolored and very rigid before the start of the experiment. The ash rate with fresh Tygon was significantly better than with the used Tygon.

Figure 15:
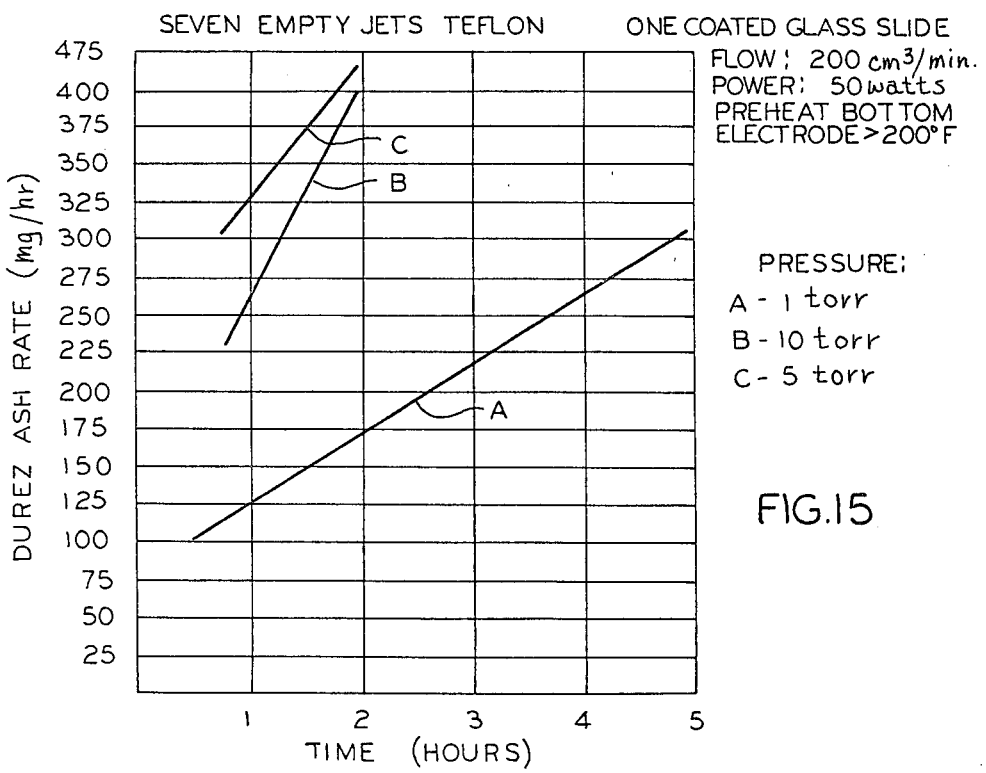

FIG. 15 shows that the ash rate using Teflon increased significantly when the pressure was increased from 1 to 5 torr while keeping all other parameters fixed. There was a slight increase in ash rate when the pressure was increased further from 5 to 10 torr. The RF power was a constant 50 watts.

Figure 16:
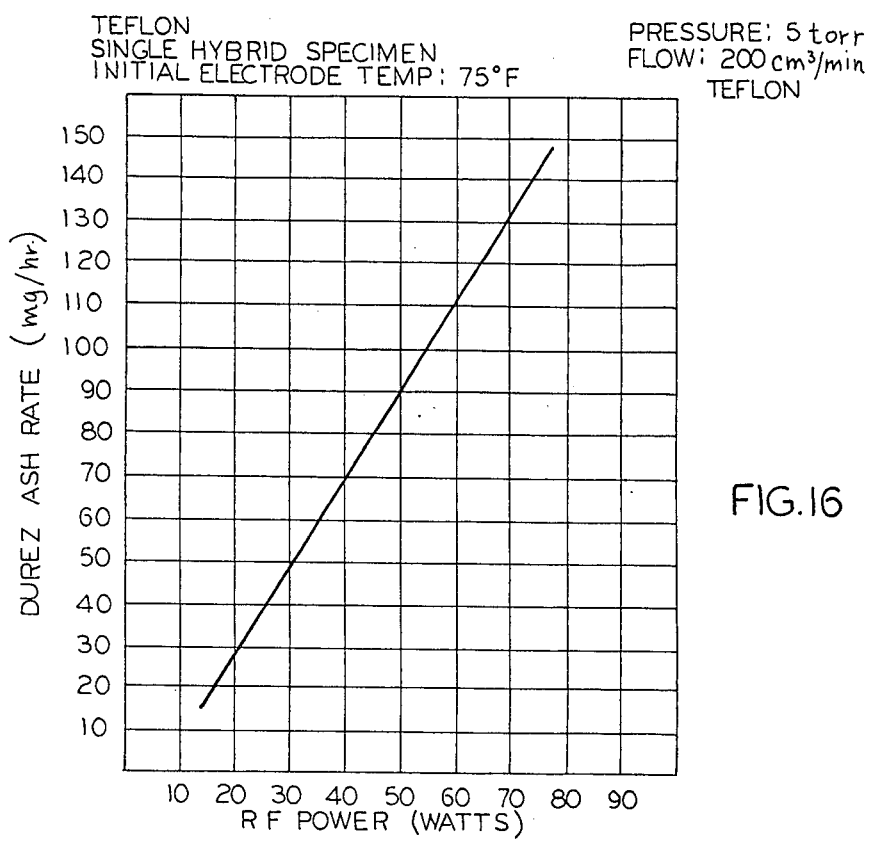
Figure 17:
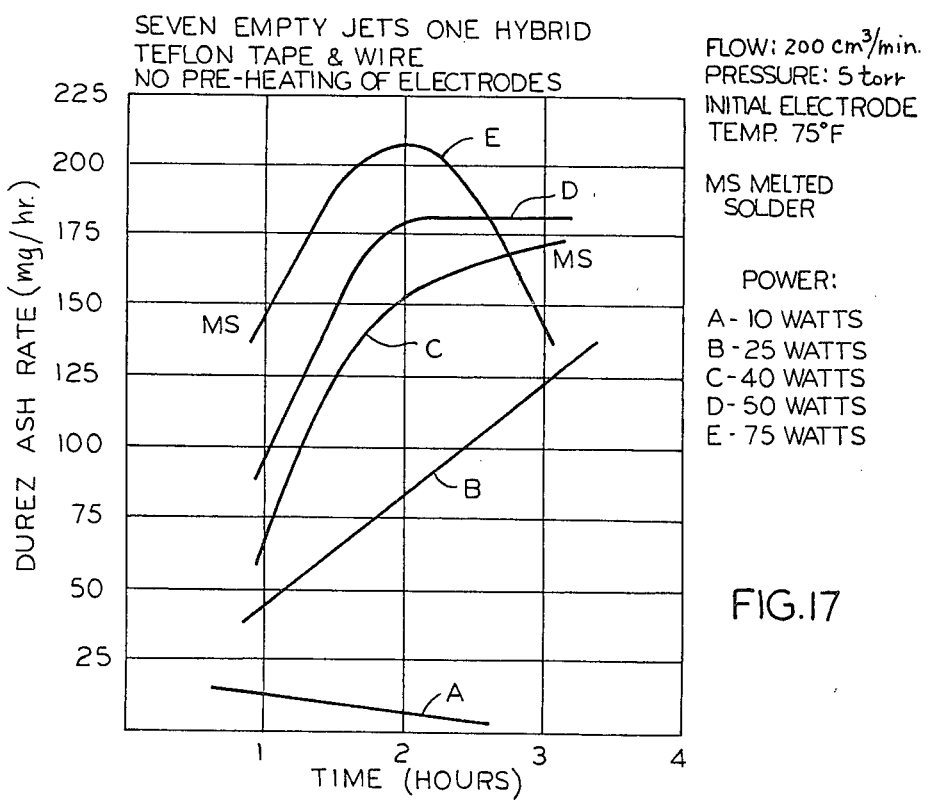

In FIG. 16 and 17 a single hybrid IC was used as the ashing specimen. FIG. 16 shows that there is a linear relationship between the first hour ash rate and the RF power for the parameters shown. FIG. 17 shows the ash rate for the first 3 hours for several power levels. The decline (FIG. 17 curve E) and the leveling off (FIG. 17 curve C and D) are a result of the decrease in material left to be oxidized on the hybrid. At the 75-watt level, the solder on the pins of the hybrid melted and reflowed during the first hour. At 50 watts, the solder melted and reflowed during the second hour; at 40 watts, the solder melted and reflowed during the third hour. Solder did not melt at powers of 10 and 25 watts for the times shown. The melting of solder correlates to the temperature of the bottom electrode. The electrode heats up from ion bombardment. With increased pressure, ion bombardment is more severe and associated electrode temperatures are higher. With increased RF power, ions have more energy and electrode temperatures are further elevated. When the bottom electrode becomes sufficiently hot, the hybrid also gets heated to the point that the solder on the pins melts and reflows.

Figure 18:
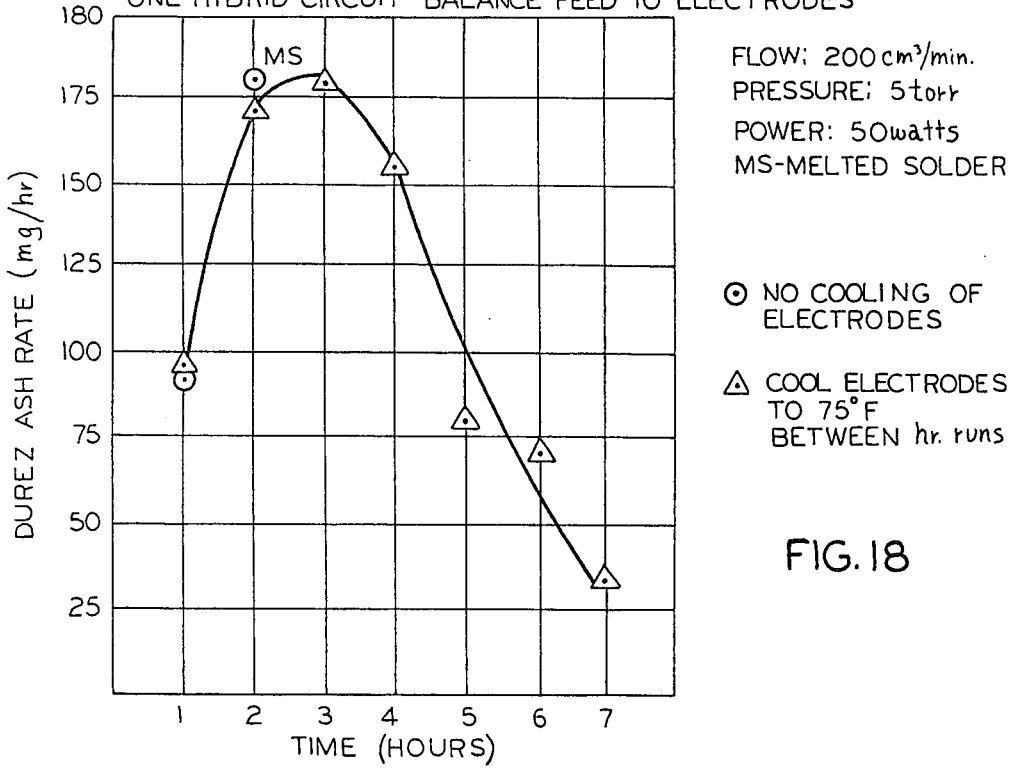

By cooling the (lower) electrode in contact with the hybrid, melting of the solder could be prevented. Under the conditions at the time, cooling of the electrodes was accomplished by removing the electrodes after each exposure hour in the plasma and running cold water over them. The temperature of the electrodes could not be controlled during the hour in the plasma. However, the initial temperature of the electrodes could be regulated in this manner. FIG. 18 (curve B) displays the results of this technique on the ashing of a single hybrid for 7 consecutive hours. During this entire time there was no melting of solder. However, as the data (FIG. 16, curve A) also show, when the electrodes are not cooled solder melts as early as the second hour. It is estimated that at the end of 7 hours approximately 90% of the Durez coating has been removed. It is impractical to cool the electrodes on a routine basis as described. It is also awkward and costly to water-cool parts that are internal to a vacuum system.

Figure 19:
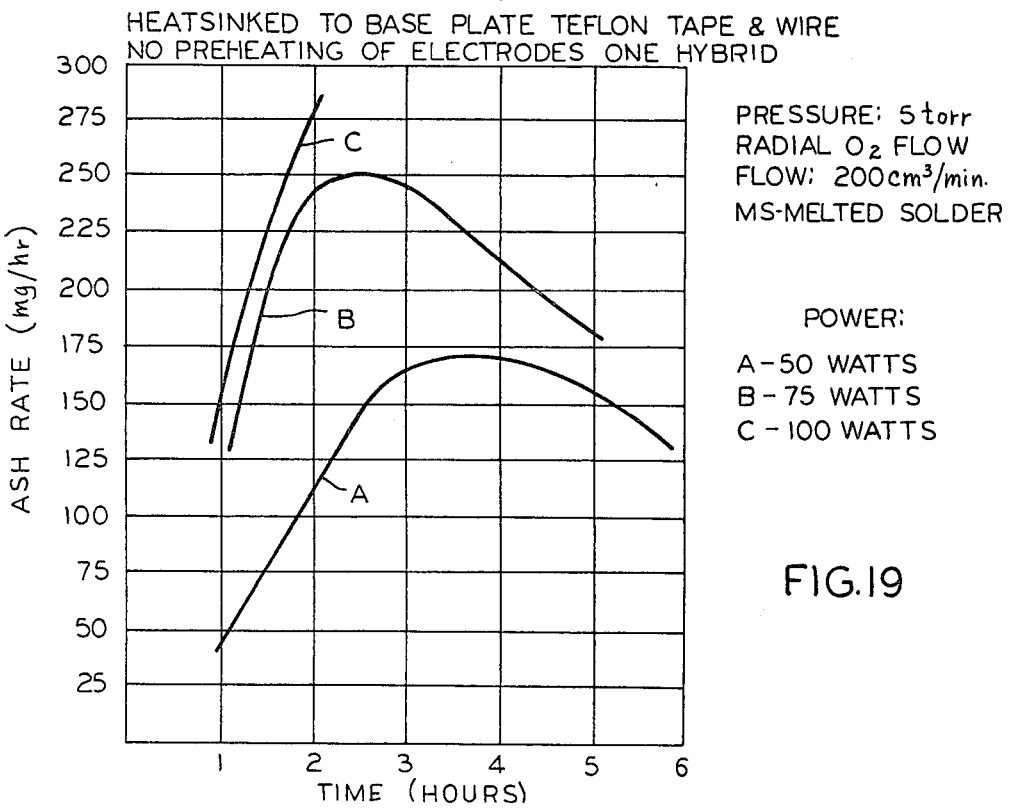

With the structure of FIG. 7, the bottom electrode conducts heat by contact with the aluminum base plate. The base plate was in turn cooled by the ambient air. The design also provided a radial flow of gas (oxygen) across the lower electrode surface to take advantage of heat convection. Results using these electrodes are shown in FIG. 19 and confirm the design. At 50 to 75 watts, there was no melting of solder on the pins of the hybrid circuits after 5 consecutive hours in the plasma. At 100 watts, the solder melted and reflowed during the second hour; thus, an upper working limit.

With the apparatus described herein several hybrid integrated circuits, e.g., ten, can be decapsulated in approximately 7 hours with a minimum of disturbance to the circuits.

What is claimed is:

1. A method for accelerating ashing rates of encapsulants in a plasma environment comprising the step of exposing at least one encapsulant to at least one gaseous plasma formed from oxygen in a reactor and simultaneously exposing a halogen substituted hydrocarbon polymer in solid form to a gaseous plasma jet formed within a cavity in a grounded conductive surface of said reactor.

2. A method in accordance with claim 1 wherein said encapsulants consist of phenolformaldehyde.

3. A method in accordance with claims 1 or 2 wherein said halogen substituted hydrocarbon polymer consists of polyvinyl chloride.

4. A method in accordance with claims 1 or 2 wherein said halogen substituted hydrocarbon polymer consists of polytetrafluorethylene.

5. A method for accelerating ashing rates of at least one encapsulant in an oxygen plasma environment in a reactor comprising the step of exposing a halogen substituted hydrocarbon polymer in solid form to an oxygen plasma jet formed within a cavity in a grounded conductive surface of said reactor.

6. A method in accordance with claim 5 wherein said halogen substituted hydrocarbon polymer consists of polyvinyl chloride.

7. A method in accordance with claim 5 wherein said halogen substituted hydrocarbon polymer consists of polytetrafluorethylene.

8. A method of accelerating ashing rates of encapsulants in a plasma reactor having a plurality of plasma jets formed within a cavity in a grounded conductive surface of said reactor comprising the steps of exposing at least one encapsulant to a gaseous plasma formed from oxygen and simultaneously exposing a halogen substituted polymer in solid form to said plurality of plasma jets.

9. A method in accordance with claim 8 wherein said halogen substituted hydrocarbon polymer consists of polyvinyl chloride.

10. A method in accordance with claim 8 wherein said halogen substituted hydrocarbon polymer consists of polytetrafluorethylene.

11. A method in accordance with claims 8, 9 or 10 wherein said plurality of plasma jets is formed of said halogen substituted polymer.

12. A method in accordance with claims 8, 9 or 10 wherein said encapsulant consists of phenolformaldehyde.

13. A method in accordance with claims 8, 9 or 10 wherein said encapsulant is an organic compound.

14. A method in accordance with claim 11 wherein said encapsulant consists of phenolformaldehyde.

15. A method for chemically ashing material in a plasma environment in a reactor comprising the steps of:
    exposing the material to a gaseous plasma formed from oxygen, and
    simultaneously exposing a halogen substituted hydrocarbon polymer in solid form to a gaseous plasma jet formed within a cavity in a grounded conductive surface of said reactor.

16. A method in accordance with claim 15 wherein said polymer comprises polyvinyl chloride.

17. A method in accordance with claim 15 wherein said polymer comprises polytetrafluorethylene.

* * * * *